(12) United States Patent
Somerville

(10) Patent No.: US 10,015,906 B1
(45) Date of Patent: Jul. 3, 2018

(54) GEO-THERMAL INVERTER COOLING SYSTEM

(71) Applicant: Cristofer D. Somerville, Cooperstown, ND (US)

(72) Inventor: Cristofer D. Somerville, Cooperstown, ND (US)

( * ) Notice: Subject to any disclaimer, the term of this patent is extended or adjusted under 35 U.S.C. 154(b) by 192 days.

(21) Appl. No.: 15/150,766

(22) Filed: May 10, 2016

(51) Int. Cl.
*H05K 7/20* (2006.01)
*F28D 15/00* (2006.01)
*H02M 7/00* (2006.01)

(52) U.S. Cl.
CPC ......... *H05K 7/20245* (2013.01); *F28D 15/00* (2013.01); *H02M 7/003* (2013.01); *H05K 7/20272* (2013.01); *H05K 7/20927* (2013.01); *F28F 2250/08* (2013.01)

(58) Field of Classification Search
CPC ........... H05K 7/20245; H05K 7/20927; H05K 7/20272; F28D 15/00; H02M 7/003; F28F 2250/08
USPC ........................................................ 361/699
See application file for complete search history.

(56) References Cited

U.S. PATENT DOCUMENTS

| | | | | |
|---|---|---|---|---|
| 5,244,037 A * | 9/1993 | Warnke | ...................... | F24D 3/18 137/565.34 |
| 5,261,251 A * | 11/1993 | Galiyano | .............. | F24F 5/0046 62/176.6 |
| 5,634,515 A * | 6/1997 | Lambert | .................. | E21B 10/58 165/45 |
| 5,706,888 A * | 1/1998 | Ambs | ...................... | F24J 3/081 165/103 |
| 6,616,415 B1 * | 9/2003 | Renken | ................... | F04C 28/08 318/433 |
| 8,851,746 B2 * | 10/2014 | Collins | ....................... | F24J 3/08 106/638 |
| 9,599,377 B2 * | 3/2017 | Kato | ........................ | F25B 27/00 |
| 2010/0230071 A1 * | 9/2010 | Slater | .................. | F24D 11/0221 165/45 |
| 2011/0011557 A1 * | 1/2011 | Shelton, Jr. | ............. | E21B 7/005 165/45 |
| 2012/0282561 A1 * | 11/2012 | Kaiser | ................... | F24H 1/0027 432/1 |
| 2013/0199516 A1 * | 8/2013 | Snyder | ....................... | F24J 2/04 126/633 |
| 2013/0255932 A1 * | 10/2013 | Doepker | ................. | F28D 15/00 165/287 |
| 2015/0233619 A1 * | 8/2015 | Shedd | ..................... | F25B 41/04 62/62 |

* cited by examiner

*Primary Examiner* — Anatoly Vortman
(74) *Attorney, Agent, or Firm* — Dave Alan Lingbeck

(57) ABSTRACT

A geo-thermal inverter cooling system for using the temperature of the ground to cool the fluid in the system. The geo-thermal inverter cooling system may include an inverter assembly including a housing and conversion electronic components for converting electrical energy to electrical power and which heat up during use; and a cooling assembly including a fluid reservoir in communication with the housing, and a pump in communication with the fluid reservoir for pumping fluid to cool the electronic components, wherein the fluid reservoir has a reservoir outlet port and reservoir inlet ports.

5 Claims, 2 Drawing Sheets

GEO-THERMAL INVERTER COOLING SYSTEM

BACKGROUND OF THE INVENTION

Field of the Invention

The present invention relates to cooling systems and more particularly pertains to a new geo-thermal inverter cooling system for using the temperature of the ground to cool the fluid in the system.

Description of the Prior Art

The use of cooling systems is known in the prior art. More specifically, cooling systems heretofore devised and utilized are known to consist basically of familiar, expected and obvious structural configurations, notwithstanding the myriad of designs encompassed by the crowded prior art which have been developed for the fulfillment of countless objectives and requirements.

The prior art includes a water cooled inverter structure forming a plurality of shallow cavities and deep cavities in a housing, fixing a bottom surface of power semiconductor modules to shallow cavities to form a shallow water channel and directly cooling the power semiconductor modules using this shallow water channel. Another prior includes an inverter device mounted on a heat sink for controlling a pump is cooled with a cooling liquid which is typically water discharged by the pump. The rate of flow of the cooling liquid supplied to the heat sink is regulated by a flow regulating mechanism based on the temperature of the heat sink detected by a temperature detecting device, for thereby keeping the temperature of the heat sink in a predetermined range. Also another prior art includes electronic devices operating a conductor arrangement that produces an electromagnetic field to transfer energy to a light rail vehicle such as a tram. The electronic devices produce heat and are cooled by being located in a cavity of a structure, at a distance to a cover at the top of the cavity, the cover forming part of the surface of the ground. The electronic device can be an inverter and located at the bottom of the cavity placed on a heat conducting material such as metal fins that extend into a shell of a material having a high heat capacity such as concrete. While these devices fulfill their respective, particular objectives and requirements, the aforementioned patents do not disclose a new geo-thermal inverter cooling system.

SUMMARY OF THE INVENTION

The general purpose of the present invention, which will be described subsequently in greater detail, is to provide a new geo-thermal inverter cooling system which has many of the advantages of the cooling systems mentioned heretofore and many novel features that result in a new geo-thermal inverter cooling system which is not anticipated, rendered obvious, suggested, or even implied by any of the prior art cooling systems, either alone or in any combination thereof. The present invention may include an inverter assembly including a housing and conversion electronic components for converting electrical energy to electrical power and which heat up during use; and a cooling assembly including a fluid reservoir in communication with the housing, and a pump in communication with the fluid reservoir for pumping, fluid to cool the electronic components, wherein the fluid reservoir has a reservoir outlet port and reservoir inlet ports. None of the prior art includes the combination of the elements of the present invention.

There has thus been outlined, rather broadly, the more important features of the geo-thermal inverter cooling system in order that the detailed description thereof that follows may be better understood, and in order that the present contribution to the art may be better appreciated. There are additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

It is an object of the present invention to provide a new geo-thermal inverter cooling system which has many of the advantages of the cooling systems mentioned heretofore and many novel features that result in a new geo-thermal inverter cooling system which is not anticipated, rendered obvious, suggested, or even implied by any of the prior art cooling systems, either alone or in any combination thereof.

Still another object of the present invention is to provide a new geo-thermal inverter cooling system for using the temperature of the ground to cool the fluid in the inverter system.

Still yet another object of the present invention is to provide a new geo-thermal inverter cooling system that routes the fluid from the inverter into the ground and then back to the inverter.

Even still another object of the present invention is to provide a new geo-thermal inverter cooling system that pumps warm fluid from the inverter system into the ground, and the ground acts as a heat exchanger and cools the fluid before it returns to the inverter system.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be made to the accompanying drawings and descriptive matter in which there are illustrated preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein.

DETAILED DESCRIPTION OF THE INVENTION

Figure 1:
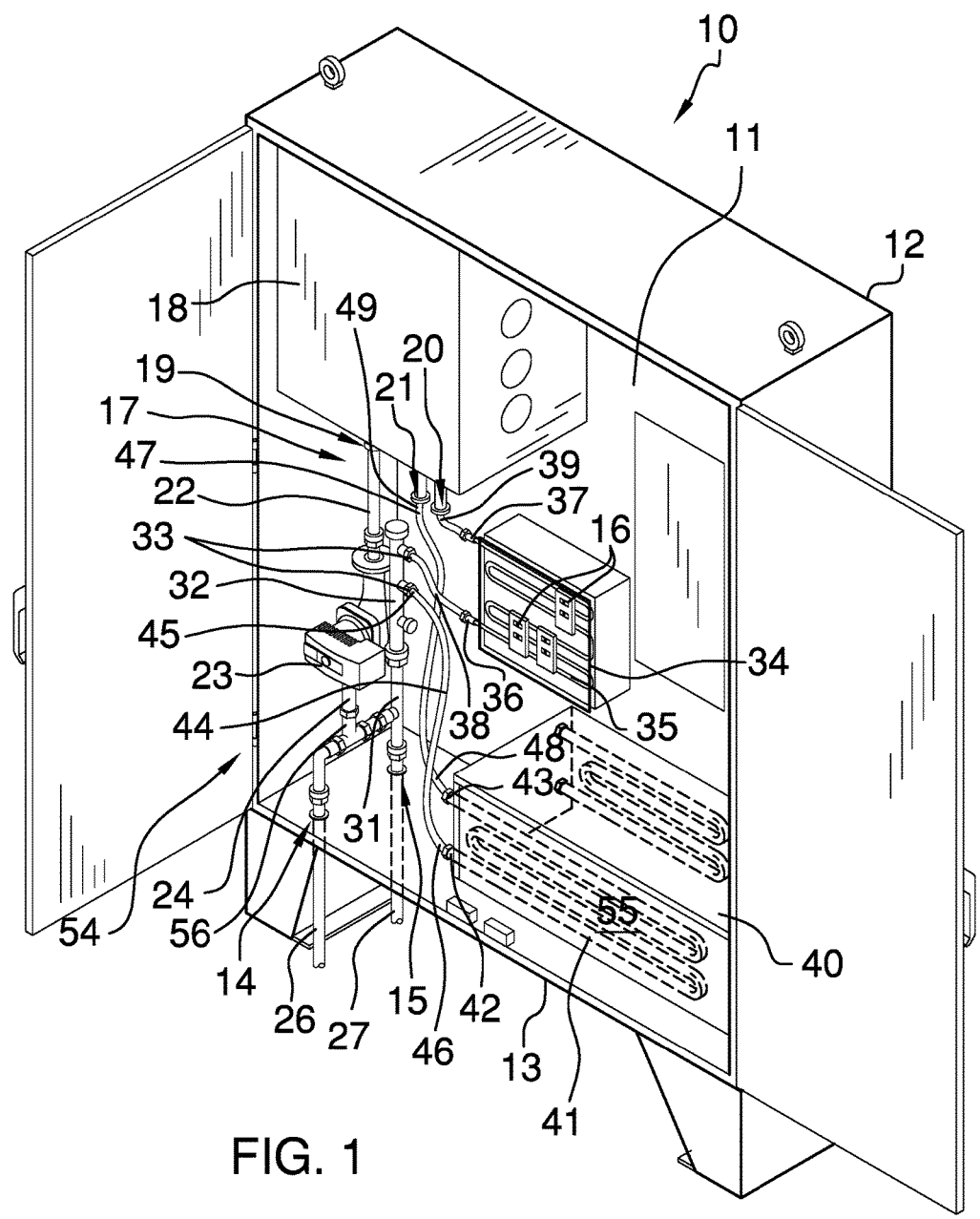
FIG. 1 is a perspective view of a new geo-thermal inverter cooling system according to the present invention.
Figure 2:
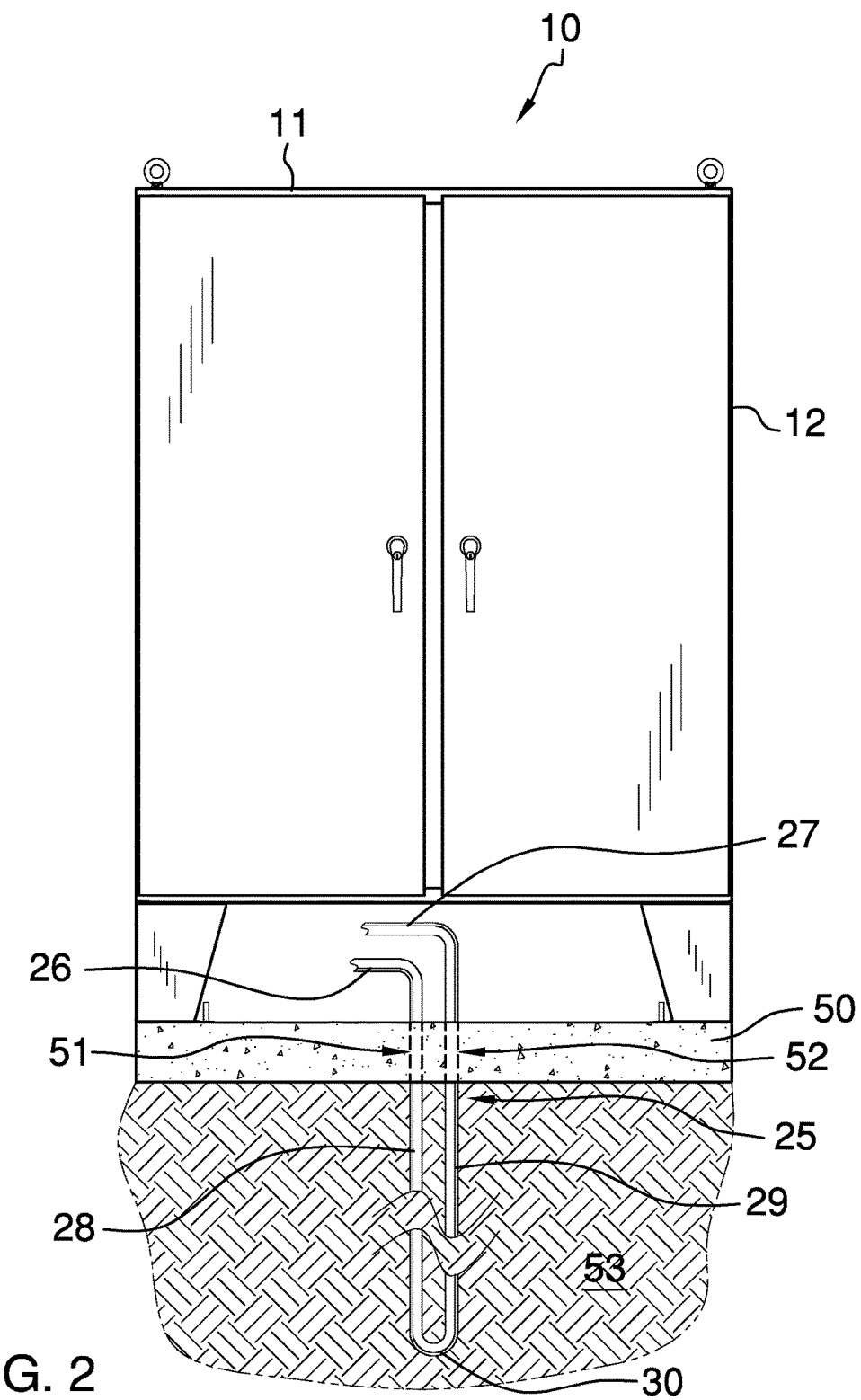
FIG. 2 is a front elevation view of the present invention.

With reference now to the drawings, and in particular to FIGS. 1 and 2 thereof, a new geo-thermal inverter cooling system embodying the principles and concepts of the present invention and generally designated by the reference numeral 10 will be described.

As best illustrated in FIGS. 1 and 2, the geo-thermal inverter cooling system 10 may generally comprise an inverter assembly 11 including a housing 12 and conversion electronic components 16 for converting electrical energy to electrical power and which heat up during use, and may also comprise a cooling assembly 17 including a fluid reservoir 18 in conventional communication with the housing 12, and a pump 23 in conventional communication with the fluid reservoir 18 for pumping fluid to cool the electronic components 16. The fluid reservoir 18 may have a reservoir outlet port 19 and reservoir inlet ports 20, 21.

As shown in FIGS. 1 and 2, the cooling assembly 17 may also include a conduit assembly 54 in conventional communication with the fluid reservoir 18 and the pump 23 for transporting fluid. The conduit assembly 54 may include a reservoir outlet conduit 22 which may be a metal pipe conventionally interconnecting the fluid reservoir 18 with the pump 23, and may also include a pump outlet conduit 24 which also may be a metal pipe in conventional communication with the pump 23, and may further include a valve 56 in conventional fluid communication with the pump outlet conduit 24. The conduit assembly 54 may further include a ground loop conduit 25 preferably a metal pipe having an inlet end 26 and an outlet end 27 and conventionally disposed in a ground 53 at a predetermined depth with the valve 56 conventionally connected to the inlet end 26 of the ground loop conduit 25, whereupon the ground 53 has a temperature colder than that of the fluid passing through the ground loop conduit 25 and the fluid passing through the ground loop conduit 25 from the pump 23 is cooled and the farther the ground loop conduit 25 is in the ground 53 the colder the temperature of the ground 53. The conduit assembly 54 may also include a loop outlet conduit 31 preferably a metal pipe and conventionally connected to the outlet end 27 of the ground loop conduit 25 and also to the valve 56, and may further include a manifold conduit 32 conventionally connected to the loop outlet conduit 31 and having outlet ports 33. The ground loop conduit 25 may include first and second end portions 28, 29 which may be disposed generally parallel to one another and may also include an arcuate intermediate portion 30 which is generally U-shaped and forms a bottom of the ground loop conduit 25. The intermediate portion 30 of the ground loop conduit 25 may be disposed at a depth of approximately 200 feet below a surface of the ground 53 to effectively cool the fluid passing through the ground loop conduit 25.

The inverter assembly 11 may also include a cement slab 50 disposed upon the surface of the ground 53 with a hole 51 disposed therethrough. The housing 12 may have a bottom wall 13 conventionally elevated above the cement slab 50 and having first and second openings 14, 15 disposed therethrough. The first end portion 28 may extend through the hole 51 of the cement slab 50 and the first opening 14 and the second end portion 29 may also extend through the hole 51 of the cement slab 50 and the second opening 15.

The cooling assembly 17 may also include a support member 34 upon which the electronic components 16 may be conventionally mounted in the housing 12. The conduit assembly 54 may be in conventional communication with the support member 34 for transporting fluid to and through the support member 34 to cool the electronic components 16. The conduit assembly 54 may further include a support member conduit 35 such as a hose which may be conventionally wound about the support member 34, and may also include a support member inlet conduit 38 which may be a hose conventionally connected to one of the outlet ports 33 of the manifold conduit 32 and to the support member conduit 35, and may further include a support member outlet conduit 39 which may be a hose conventionally connected to the support member conduit 35 and to one of the inlet ports 20 of the fluid reservoir 18. The cooling assembly 17 may also include a tank 40 and oil 55 disposed in the tank 40 with the tank 40 adapted to receive transformer devices submerged in the oil 55. The cooling assembly 17 may further include an oil cooling arrangement 41 such as a water jacket or radiator coils conventionally disposed about the tank 40 and having an entrance port 42 and an exit port 43. The conduit assembly 54 may include an oil cooling inlet conduit 44 which may be a hose having a first end 45 conventionally connected to one of the outlet ports 33 of the manifold conduit 32 and having a second end 46 conventionally connected to the entrance port 42 of the oil cooling arrangement 41, and may also include an oil cooling outlet conduit 47 which may also be a hose having a first end 48 conventionally connected to the exit port 43 of the arrangement 41 and having a second end 49 conventionally connected to one of the reservoir inlet ports 21.

In use, the electronic components 16, transformer devices and fluid reservoir 18 may be disposed above ground 53. The ground loop conduit 25 may be conventionally disposed into the ground at a selected depth. The intermediate portion 30 of the ground loop conduit 25 may be disposed to a depth of approximately 200 feet below a surface of the ground 53. The fluid from the fluid reservoir 18 may be circulated through the conduit assembly 54 to cool the electronic components 16 and transformer devices. The fluid may be circulated through the ground loop conduit 25, whereupon the fluid is cooled by the temperature of the ground 53 and the ground 53 functions as a heat exchanger. The fluid may be circulated from the fluid reservoir 18, through the ground loop conduit 25, through the conduit assembly 54 and back to the fluid reservoir 18.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the geo-thermal inverter cooling system. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A geo-thermal inverter cooling system comprising:
   an inverter assembly including a housing and conversion electronic components for converting electrical energy to electrical power and which heat up during use, wherein the inverter assembly also includes a cement slab disposed upon the surface of the ground with a hole disposed therethrough, wherein the housing has a bottom wall elevated above the cement slab and having first and second openings disposed therethrough; and a cooling assembly including a fluid reservoir in communication with the housing, and a pump in communication with the fluid reservoir for pumping fluid to cool the electronic components, wherein the fluid reservoir has a reservoir outlet port and reservoir inlet ports, wherein the cooling assembly also includes a conduit assembly in communication with the fluid reservoir and the pump for transporting fluid, wherein the conduit assembly includes a reservoir outlet conduit interconnecting the fluid reservoir with the pump, and also includes a pump outlet conduit in communication with the pump, and further includes a valve in communication with the pump outlet conduit, wherein the conduit assembly further includes a ground loop conduit having an inlet end and an outlet end and disposed in a ground at a predetermined depth with the valve connected to the inlet end of the ground loop conduit, whereupon the ground has a temperature colder than that of the fluid passing through the ground loop conduit and the fluid passing through the ground loop conduit from the pump is cooled, wherein the conduit assembly also includes a loop outlet conduit connected to the outlet end of the ground loop conduit, and further includes a manifold conduit connected to the loop outlet conduit and to the valve and having outlet ports, wherein the ground loop conduit includes first and second end portions which are disposed generally parallel to one another and also includes an arcuate intermediate portion which is generally U-shaped and forms a bottom of the ground loop conduit.

2. The geo-thermal inverter cooling system as described in claim 1, wherein the first end portion extends through the hole of the cement slab and the first opening and the second end portion extends through the hole of the cement slab and the second opening.

3. A geo-thermal inverter cooling system comprising:

an inverter assembly including a housing and conversion electronic components for converting electrical energy to electrical power and which heat up during use; and a cooling assembly including a fluid reservoir in communication with the housing, and a pump in communication with the fluid reservoir for pumping fluid to cool the electronic components, wherein the fluid reservoir has a reservoir outlet port and reservoir inlet ports, wherein the cooling assembly also includes a conduit assembly in communication with the fluid reservoir and the pump for transporting fluid, wherein the conduit assembly includes a reservoir outlet conduit interconnecting the fluid reservoir with the pump, and also includes a pump outlet conduit in communication with the pump, and further includes a valve in communication with the pump outlet conduit, wherein the conduit assembly further includes a ground loop conduit having an inlet end and an outlet end and disposed in a ground at a predetermined depth with the valve connected to the inlet end of the ground loop conduit, whereupon the ground has a temperature colder than that of the fluid passing through the ground loop conduit and the fluid passing through the ground loop conduit from the pump is cooled, wherein the conduit assembly also includes a loop outlet conduit connected to the outlet end of the ground loop conduit, and further includes a manifold conduit connected to the loop outlet conduit and to the valve and having outlet ports, wherein the cooling assembly also includes a tank and oil disposed in the tank with the tank adapted to receive transformer devices submerged in the oil.

4. The geo-thermal inverter cooling system as described in claim 3, wherein the cooling assembly further includes an oil cooling arrangement disposed about the tank and having an entrance port and an exit port.

5. The geo-thermal inverter cooling system as described in claim 4, wherein the conduit assembly includes an oil cooling inlet conduit having a first end connected to one of the outlet ports of the manifold conduit and having a second end connected to the entrance port of the oil cooling arrangement, and also includes an oil cooling outlet conduit having a first end connected to the exit port of the oil cooling arrangement and having a second end connected to one of the reservoir inlet ports.

* * * * *